United States Patent
Wang et al.

(10) Patent No.: US 9,961,279 B1
(45) Date of Patent: May 1, 2018

(54) BLOOMING FREE HIGH DYNAMIC RANGE IMAGE SENSOR READ OUT ARCHITECTURE USING IN-FRAME MULTI-BIT EXPOSURE CONTROL

(71) Applicant: OMNIVISION TECHNOLOGIES, INC., Santa Clara, CA (US)

(72) Inventors: Rui Wang, San Jose, CA (US); Tiejun Dai, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 8 days.

(21) Appl. No.: 15/384,872

(22) Filed: Dec. 20, 2016

(51) Int. Cl.
| | |
|---|---|
| H04N 5/355 | (2011.01) |
| H04N 5/374 | (2011.01) |
| H04N 5/378 | (2011.01) |
| H04N 5/235 | (2006.01) |
| H04N 5/359 | (2011.01) |
| H04N 5/376 | (2011.01) |
| H01L 27/146 | (2006.01) |

(52) U.S. Cl.
CPC ....... H04N 5/3559 (2013.01); H01L 27/1461 (2013.01); H01L 27/14612 (2013.01); H01L 27/14643 (2013.01); H04N 5/2353 (2013.01); H04N 5/3594 (2013.01); H04N 5/378 (2013.01); H04N 5/3765 (2013.01)

(58) Field of Classification Search
CPC ............. H04N 5/35572; H04N 5/3745; H04N 5/37457; H04N 5/378; H01L 27/14643; H01L 27/14638
See application file for complete search history.

(56) References Cited

U.S. PATENT DOCUMENTS

| | | |
|---|---|---|
| 6,920,078 B2 | 7/2005 | Cho |
| 6,999,374 B2 | 2/2006 | Cho |
| 7,190,397 B2 | 3/2007 | Andersson |
| 8,072,518 B2 | 12/2011 | Araki et al. |
| 8,093,541 B2 | 1/2012 | Chen |
| 8,742,311 B2 | 6/2014 | Manabe |
| 8,896,743 B2 | 11/2014 | Du et al. |
| 9,118,851 B2 | 8/2015 | Dai et al. |

(Continued)

OTHER PUBLICATIONS

U.S. Appl. No. 15/384,859, filed Dec. 20, 2016, Dai et al.
U.S. Appl. No. 15/384,866, filed Dec. 20, 2016, Wang et al.

*Primary Examiner* — Abdelaaziz Tissire
(74) *Attorney, Agent, or Firm* — Christensen O'Connor Johnson Kindness PLLC

(57) ABSTRACT

A pixel circuit includes a transfer transistor coupled between a photodiode and a floating diffusion to selectively transfer image charge accumulated in the photodiode to the floating diffusion. A selection circuit is coupled to select one of a first transfer control signal, a second transfer control signal, or a third transfer control signal to control the transfer transistor. The selection circuit is coupled to output the first transfer control signal in response to a precharge enable signal during a read out operation of a different row than a row in which the transfer transistor is included, to output the second transfer control signal in response to a sample enable signal during a read out operation of the row in which the transfer transistor is included, and output the third transfer control signal to partially turn on the transfer transistor during an idle state of the pixel circuit.

22 Claims, 4 Drawing Sheets

(56) References Cited

U.S. PATENT DOCUMENTS

| | | |
|---|---|---|
| 2006/0023109 A1 | 2/2006 | Mabuchi et al. |
| 2008/0239111 A1* | 10/2008 | Jiang ............... H04N 5/361 |
| | | 348/243 |
| 2008/0284888 A1 | 11/2008 | Kobayashi |
| 2009/0256060 A1* | 10/2009 | Meynants ........... H04N 5/353 |
| | | 250/208.1 |
| 2010/0245647 A1 | 9/2010 | Honda et al. |
| 2010/0276572 A1 | 11/2010 | Iwabuchi et al. |
| 2012/0057056 A1 | 3/2012 | Oike |
| 2012/0307030 A1 | 12/2012 | Blanquart |
| 2014/0103411 A1* | 4/2014 | Dai ............... H01L 27/14609 |
| | | 257/292 |
| 2014/0124889 A1* | 5/2014 | Qian ............. H01L 27/14618 |
| | | 257/448 |
| 2014/0252208 A1 | 9/2014 | Fujinaka et al. |
| 2015/0138410 A1* | 5/2015 | Dai ................. H04N 5/37457 |
| | | 348/300 |
| 2015/0237274 A1 | 8/2015 | Yang et al. |
| 2017/0332023 A1* | 11/2017 | Panicacci ........... H04N 5/3592 |

\* cited by examiner

BLOOMING FREE HIGH DYNAMIC RANGE IMAGE SENSOR READ OUT ARCHITECTURE USING IN-FRAME MULTI-BIT EXPOSURE CONTROL

BACKGROUND INFORMATION

Field of the Disclosure

The present invention is generally related to image sensors, and more specifically, the present invention is directed to high dynamic range image sensors.

Background

An image capture device includes an image sensor and an imaging lens. The imaging lens focuses light onto the image sensor to form an image, and the image sensor converts the light into electric signals. The electric signals are output from the image capture device to other components of a host electronic system. The electronic system may be, for example, a mobile phone, a computer, a digital camera or a medical device.

The demands on the image sensor to perform over a large range of lighting conditions, varying from low light conditions to bright light conditions are becoming more difficult to achieve as pixel circuits become smaller. This performance capability is generally referred to as having high dynamic range imaging (HDRI or alternatively just HDR). High dynamic range imaging is a very desirable feature for a number of applications such as for example automotive and machine vision. In conventional image capture devices, pixel circuits require multiple successive exposures such that the image sensor is exposed to both low and high light levels to achieve HDR. Traditional complementary metal oxide semiconductor (CMOS) image sensors suffer from low dynamic range due to limited well-capacity and fixed exposure times. Another challenge faced by traditional CMOS image sensors is blooming, which occurs when the amount of image charge generated in a photodiode exceeds the storage capacity of the pixel circuit, and overflows into neighboring pixel circuits.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
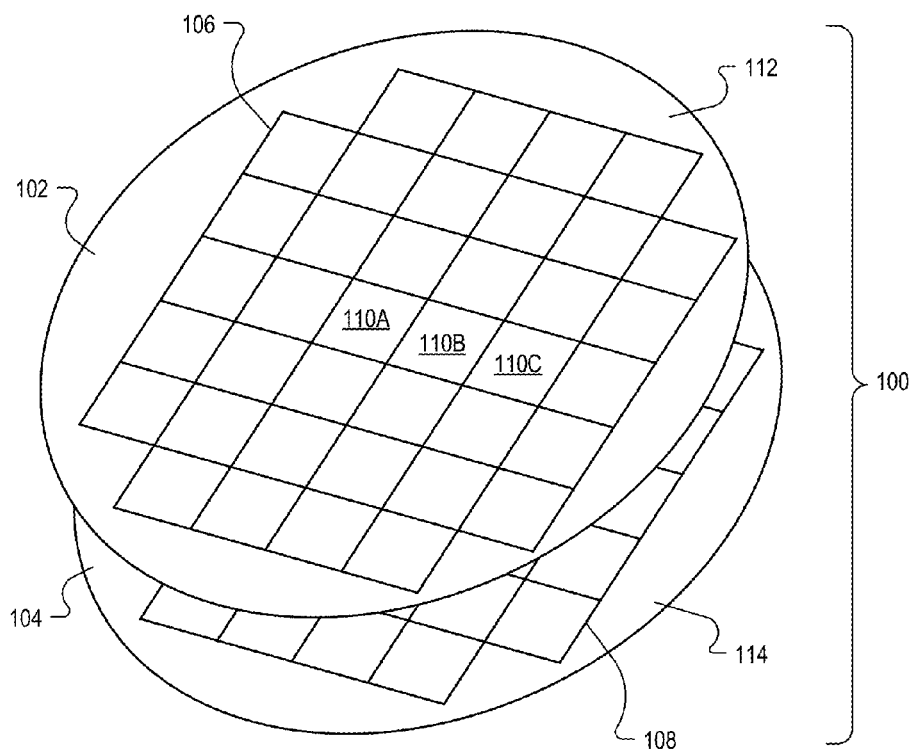
FIG. 1 is an exploded view of one example of stacked semiconductor device wafers with integrated circuit dies of an example blooming free imaging system with a high dynamic range image sensor read out architecture using in-frame multi-bit exposure control in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As will be discussed, examples in accordance with the teaching of the present invention describe a blooming free image sensor pixel circuit for use in a high dynamic range (HDR) image sensor, including control circuitry for controlling exposure and reading out HDR image data from each pixel circuit. As will be shown, a highly-programmable and high-efficiency exposure control and read out architecture is provided that improves the dynamic range performance with pixel hybrid bond technology. In the examples, a set-reset latch is included in the pixel circuits to control a switch that is coupled in parallel with precharge and sample circuitry to suppress blooming. In various examples, the pixel arrays are disposed in a separate wafer from peripheral circuits, and two wafers are bonded together with pixel level bonding. There is a memory to store the exposure information for each pixel circuit, or each block of pixel circuits, right underneath the pixel circuits or blocks of pixel circuits. In various examples, in-frame programmable exposure control of each individual pixel circuit across the pixel array is provided with multi-bit resolution, which achieves optimal operation of each pixel circuit across the pixel array. Compared to known HDR imaging solutions, examples in accordance with the teachings of the present invention can achieve individual in-frame exposure control for each individual pixel circuit, which lead to improved charge integration across the pixel array. Such exposure control and read out techniques in accordance with the teaching of the present invention suppress blooming as well as eliminate the need for multi-frame combinations or down-sampling of pixel circuit rows during read out, which lead to high frame rate and high spatial resolution in accordance with the teachings of the present invention.

To illustrate, FIG. 1 is an exploded view of one example of stacked semiconductor device wafers 102 and 104 with integrated circuit dies of an example single blooming free image sensing system 100 in accordance with the teachings of the present invention. In various examples, semiconductor device wafers 102 and 104 may include silicon, or other suitable semiconductor materials. In the illustrated example, device wafer 102 is a top sensor chip that includes a pixel array 106 having a pixel circuits 110A, 110B, 110C, etc., disposed in a first semiconductor layer 112. Device wafer 102 is stacked with device wafer 104, which includes corresponding support circuitry 108 disposed in a second semiconductor layer 114 and coupled to pixel array 106 through pixel level hybrid bonds to support operation of the photon detection array 106 in accordance with the teachings of the present invention.

As will be discussed in more detail below, in some examples, the pixel circuits 110 in first semiconductor layer 112 include photodiodes that are coupled to floating diffusions through transfer transistors, the corresponding support circuits 108 included in the second semiconductor layer 114 include select circuits that are coupled to: output first transfer control signals coupled to transfer transistors during precharge periods in response to precharge enable signals during read out operations of different rows that do not include transfer transistors, output second transfer control signals during sample periods in response to a sample enable signals to transfer transistors during read out operations of the same rows that include the transfer transistors, and output third transfer control signals during idle periods to suppress blooming in accordance with the teachings of the present invention. In the various examples, the select circuits included in support circuits 108 may include an exposure memory so that each individual pixel may have a multi-bit (e.g., 4-bits) exposure value stored in it. This exposure memory may be interconnected through the pixel level hybrid bonds to the pixel circuits disposed in the first semiconductor layer. The exposure memory may be implemented a static random access memory, or other suitable type of memory. In addition, in various examples, the exposure memory may also be shared among a block of pixel circuits, such as for example of block of 8×8 pixel circuits.

It is noted that the example image sensing system 100 shown in FIG. 1 is illustrated with two stacked semiconductor device wafers 102 and 104 for explanation purposes. In other examples, it is appreciated that the image sensing system 100 may include more than two stacked semiconductor device wafers for additional functions, features, and improved performance in accordance with the teachings of the present invention.

Figure 2:
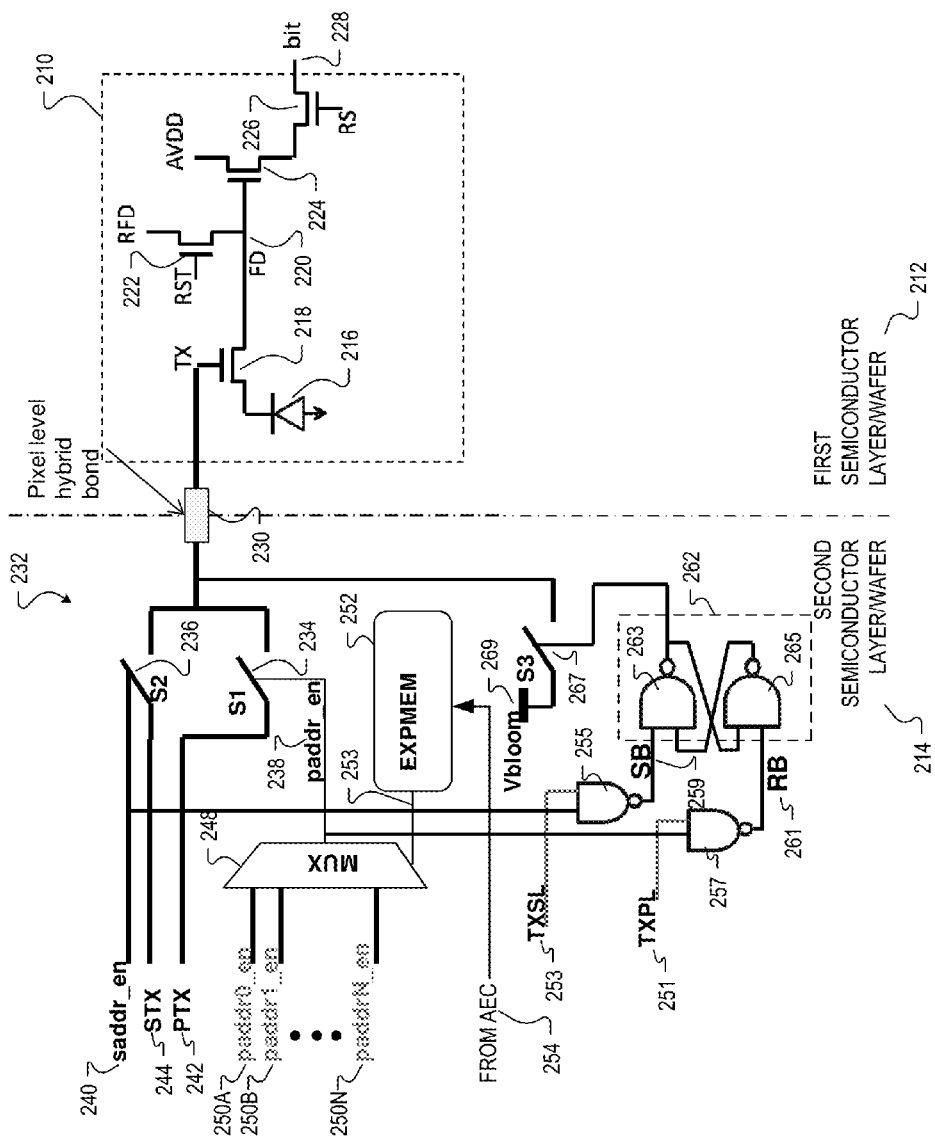
FIG. 2 is a circuit diagram showing an example of a portion of the circuitry of a pixel circuit including a blooming free high dynamic range read out architecture using in-frame multi-bit exposure in accordance with the teachings of the present invention.

FIG. 2 is a circuit diagram showing an example of a portion of the circuitry of a pixel circuit 210 including a blooming free high dynamic range read out architecture using in-frame multi-bit exposure coupled to a select circuit 232 in accordance with the teachings of the present invention. It is noted that pixel circuit 210 may be an example of one of the pixel circuits 110A, 110B, 110C of pixel array 106 of FIG. 1, and that similarly named and numbered elements referenced below are coupled and function similar to as described above. As shown in the depicted example, pixel circuit 210 is disposed in a first semiconductor layer 212. Pixel circuit 210 includes a photodiode 216 disposed in a first semiconductor layer 212 adapted to accumulate image charge in response to incident light. A transfer transistor 218 disposed in the first semiconductor layer 212 is coupled between the photodiode 216 and a floating diffusion 220 disposed in the first semiconductor layer 212 to selectively transfer the image charge accumulated in the photodiode 216 to the floating diffusion 220.

Continuing with the illustrated example, a reset transistor 222 is disposed in the first semiconductor layer 212 and coupled to the floating diffusion 220 to selectively reset the floating diffusion 220 in response to a reset RST signal. In the example, the reset transistor is coupled between a reset floating diffusion RFD voltage and the floating diffusion 220. An amplifier transistor 224 is disposed in the first semiconductor layer 212 and includes an amplifier gate terminal coupled to the floating diffusion 220. In the example, the amplifier transistor 224 is a source-follower coupled transistor, and has a drain terminal coupled to an AVDD voltage and a source terminal coupled to provide the amplified output of amplifier transistor 224. A row select transistor 226 is disposed in the first semiconductor layer 212 and is coupled between a bitline 228 and the amplifier transistor 224. In operation, the row select transistor 226 is coupled to output the image data of pixel circuit 210 in response to a row select signal RS.

A select circuit 232 is disposed in a second semiconductor layer 214 and is coupled to a control terminal of the transfer transistor 218 through a pixel level hybrid bond 230 between the first semiconductor layer 212 and second semiconductor layer 214 to select one of a first transfer control signal PTX 242, a second transfer control signal STX 244, and a third transfer control signal Vbloom 269 to control the transfer transistor 218 in accordance with the teachings of the present invention. As will be discussed in further detail below, the select circuit 232 may be one of a plurality of select circuits that coupled to corresponding pixel circuits 210 of a pixel array in accordance with the teachings of the present invention.

In the example depicted in FIG. 2, select circuit 232 is coupled to output the first transfer control signal PTX 242 in response to a precharge enable signal paddr_en 238 during a read out operation of a different row than a row of the pixel array in which the transfer transistor 218 is included. The select circuit 232 is coupled to output the second transfer control signal STX 244 in response to a sample enable signal saddr_en 240 during a read out operation of a pixel circuit in the same row of the pixel array in which the transfer transistor 218 is included. The select circuit 232 is also coupled to output the third transfer control signal Vbloom 269 to partially turn on the transfer transistor 218 during an idle state of the pixel circuit 210. Accordingly, the first transfer control signal PTX 242 can be used to independently precharge the pixel circuit 210 to control the exposure of pixel circuit 210, while a different row is of the pixel array is being read out with the second transfer control signal STX 244 in accordance with the teachings of the present invention. Furthermore, the transfer transistor may be partially turned on during an idle state to suppress blooming in accordance with the teachings of the present invention. Therefore, individual in-frame exposure control for each individual pixel circuit 210 is realized with suppressed blooming, which leads to improved charge integration across the entire pixel array to provide high dynamic range image sensing in accordance with the teachings of the present invention.

As shown in the example depicted in FIG. 2, select circuit 232 includes a first switch S1 234 coupled to generate the first transfer control signal PTX 242 in response to the precharge enable signal paddr_en 238 during a precharge operation or state, a second switch S2 236 coupled to generate the second transfer control signal STX 244 in response to the sample enable signal saddr_en 240 during a sample operation or state. A multiplexor circuit 248 is coupled to generate the precharge enable signal paddr_en 238 in response to a selection of one of a plurality of precharge row signals, illustrated in FIG. 2 as paddr0_en 250A, paddr1_en 250B, . . . , paddrN_en 250N, in response to an exposure value signal 253, which is stored in an exposure memory EXPMEM 252. In one example, the exposure value represented by exposure value signal 253 stored in exposure memory EXPMEM 252 is a multi-bit (e.g., 4-bit) value received from an automatic exposure control (AEC) circuit 254. As will be discussed in greater detail below, in one example, the exposure value stored in exposure memory EXPMEM 252 is used to adjust the exposure of the image data generated by pixel circuit 210. In another example, the exposure value stored in exposure memory EXPMEM 252 may be shared by a block of pixels to adjust the exposure of the image data generated by the block of pixels in a pixel array including pixel circuit 210, such as for example an 8×8 block of neighboring pixels.

The example depicted in FIG. 2 also illustrates a third switch S3 267 coupled to generate the third transfer control signal Vbloom 269 in response to an output of set-reset latch 262 during an idle state of pixel circuit 210 to partially turn on transfer transistor 218 to suppress blooming. In the depicted example, the third transfer control signal Vbloom 269 is an anti-blooming transfer control signal, and the magnitude of the voltage of the third transfer control signal Vbloom 269 is therefore less than the magnitudes of the first and second transfer control signals PTX 242 and STX 244 in order to only partially turn on transfer transistor 218 instead of fully turn on the transfer transistor 218 during the precharge and sample operations with the first and second transfer control signals PTX 242 and STX 244.

In the example depicted in FIG. 2, the latch 262 includes cross-coupled NAND gates 263 and 265 as shown. In the example, the set input SB 259 of latch 262 is coupled to receive the output of a NAND gate 255, and the reset input RB 261 of latch 262 is coupled to receive the output of NAND gate 257. NAND gate 255 is coupled to receive sample enable signal saddr_en 240 and a first clock signal TXSL 253. NAND gate 257 is coupled to receive precharge enable signal paddr_en 238 and a second clock signal TXPL 251. In the example, first and second clock signals TXSL 253 and TXPL 251 are periodic signals to clock the latch 262. Thus, latch 262 is coupled to be set in response to the sample enable signal saddr_en 240 and a first clock signal TXSL 253, and reset in response to the precharge enable signal paddr_en 238 and a second clock signal TXPL 251.

In an example in which the pixel array is read out with a rolling shutter, and in which there are only 11 possible rows of a pixel array that can be precharged at a time (i.e., N=10 for paddr0_en 250A, paddr1_en 250B, . . . , paddrN_en 250N), plus the one row that is being read out at a time, there can only be a maximum load of only 12 possible rows of the pixel array that can be loaded on the first transfer control signal PTX 242 the second transfer control signal STX 244 at any one time. In other words, in the example with N=10, for each row that is being read out with the rolling shutter, there can only be 11 other enabled rows in the pixel array that can be precharged at a time. All other rows in the pixel array are ignored for that specific row that is being read out at the time. It is therefore appreciated of course that this maximum load of only 12 rows on the first and second transfer control signals PTX 242 and STX 244 at any one time is significantly less than an example in which every row of the entire pixel array could to be driven by the first and second transfer control signals PTX 242 and STX 244 at one time.

Stated in another way, the first transfer control signal PTX 242 is generated based on precharge address, so at each time, only N+1 rows receive the first transfer control signal PTX 242. The total loading of a source driving the first and second transfer control signals PTX 242 and STX 244 is therefore only N+2 rows, instead of an entire pixel array of the order of $2^N$ rows. Thus, it is appreciated that the total number of rows of a pixel array including pixel circuit 210 that can be precharged and therefore receive the first transfer control signal PTX 242 at a time is equal to a total number of different possible exposure values that can be stored by the exposure memory EXPMEM, which is a significantly less loading requirement than an example in which the all of the of rows in the pixel array were to be driven simultaneously.

Figure 3:
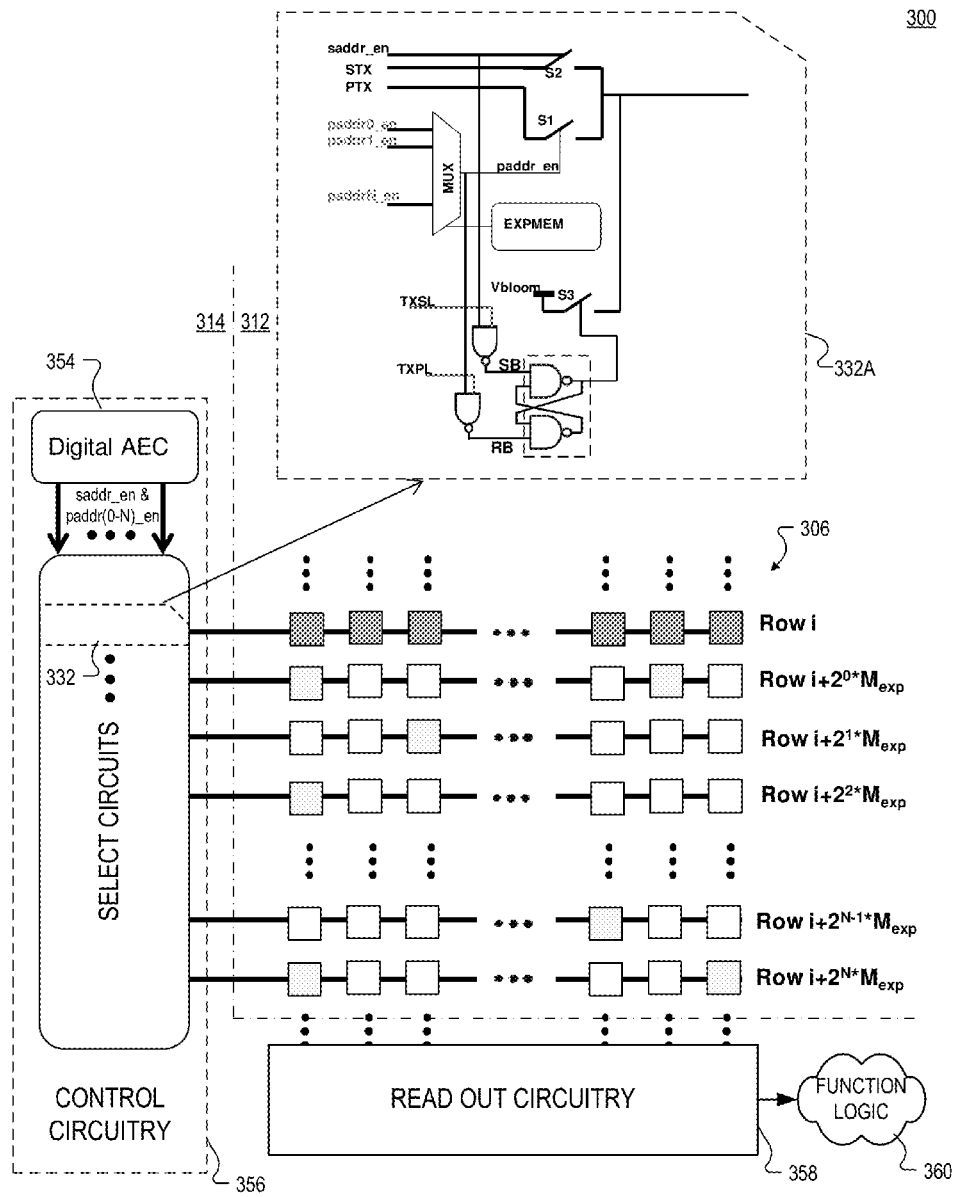
FIG. 3 is a block diagram illustrating an example blooming free imaging system including a pixel array of pixel circuits having a high dynamic range read out architecture using in-frame multi-bit exposure in accordance with the teachings of the present invention.

FIG. 3 is a block diagram illustrating an example imaging system 300 including a pixel array 306 of pixel circuits having a blooming free high dynamic range read out architecture using in-frame multi-bit exposure in accordance with the teachings of the present invention. In the illustrated example, it is appreciated that each of the pixel circuits included in pixel array 306 of FIG. 3 may be examples of the pixel circuits 110A, 110B, 110C of pixel array 106 of FIG. 1, or of pixel circuit 210 of FIG. 2, and that similarly named and numbered elements referenced below are coupled and function similar to as described above. As shown in the example depicted in FIG. 3, control circuitry 356 is coupled to the pixel array 306 to control the operation of the pixel array 306 including independently controlling an exposure time for each one of the pixel circuits in the pixel array 306 for a single frame in accordance with the teachings of the present invention. In the example, read out circuitry 358 is coupled to the pixel array 306 to read out image data from the plurality of pixel circuits of pixel array 306. In one example, the image data that is read out by read out circuitry 358 is transferred to function logic 360.

In the depicted example, the pixel circuits of pixel array 306 are disposed in a first semiconductor layer 312, and the control circuitry 356, read out circuitry 358, and function logic 360 are disposed in second semiconductor layer 314. In the example, the first and second semiconductor layers 312 and 314 are stacked and coupled together in a stacked chip scheme. In one example, the select circuits 332 are coupled to each pixel circuit of pixel array 306 through pixel level hybrid bonds (see, e.g., pixel level hybrid bond 230 in FIG. 2).

In one example, read out circuitry 358 may include amplification circuitry, analog-to-digital (ADC) conversion circuitry or otherwise. Function logic 360 may simply store the image data or even manipulate the image data by applying post image effects (e.g., crop, rotate, remove red eye, adjust brightness, adjust contrast or otherwise). Pixel array 306 may be implemented as a front side illuminated image sensor or a back side illuminated image sensor. As illustrated, each pixel circuit is arranged into rows and columns in pixel array 306 to acquire image data of a person, place or object, which can then be used to render an image of the person, place or object.

As shown in the depicted example, the control circuitry 356 includes a digital automatic exposure control (AEC) 354 coupled to select circuits 332. In one example, it is appreciated that AEC 354 may also include row decoder elements to provide the sample address and precharge address enable signals (e.g., saddr_en and paddr(0-N)_en). As can be appreciated in the detailed version of select circuit 332A illustrated in FIG. 3, the select circuits 332 may be examples of the select circuit 232 illustrated in FIG. 2. Accordingly, similarly named and numbered elements referenced below are coupled and function similar to as described above. In the depicted example, the AEC 354 is coupled to generate the exposure values stored in the exposure memory EXPMEM of the select circuits 310. In addition, the AEC 354 is also coupled to generate the sample address enable signals (e.g., saddr_en) as well as the precharge address enable signals (e.g., paddr(0-N)_en) that are coupled to be received by the select circuits 332.

In one example, AEC 354 is coupled to read the image data from read out circuitry 358 to determine, based on the image data values of pixel circuits from a previous frame, any individual pixel circuits in pixel array 306 that may benefit from precharging, and therefore additional exposure time, in a subsequent frame to provide HDR imaging in accordance with the teachings of the present invention. As such, AEC 354 is coupled to provide the corresponding exposure values for the exposure memories EXPMEM in the select circuits 332 as well as the corresponding sample address enable signals saddr_en and precharge address enable signals paddr(0-N)_en in accordance with the teachings of the present invention.

As mentioned, control circuitry 356 also includes corresponding row decoder circuitry coupled to AEC 354 to control the switches S1, S2, and S3 in the select circuits of each pixel circuit to provide the first, second, and third transfer control signals PTX, STX, and Vbloom to the transfer transistors that are included in the row of pixel circuits the pixel array 306 in accordance with the teachings of the present invention.

In a rolling shutter design example of operation, assume that Row i of pixel array 306 is being read out. As such, the transfer transistors in the pixel circuits of Row i are coupled to receive the STX transfer control signal when the transfer transistors are activated during a sample or read out operation while Row i is read out. In the depicted example, Rows $i+2^{(0-N)}*m_{exp}$ may be coupled to be precharged during a precharge operation or state, where N is an integer greater than or equal to zero, and $M_{exp}$ is an exposure factor. Thus, assuming for example that N=10 and the exposure factor of $M_{exp}=1$, the N+1, or 11 other rows of the pixel array 306 that may be precharged and receive the PTX transfer control signal to provide additional exposure time for high dynamic range imaging are: Row $i+2^0 *M_{exp}$, Row $i+2^1*M_{exp}$, Row $i+2^2*M_{exp}$, ..., Row $i+2^9*M_{exp}$, and Row $i+2^{10}*M_{exp}$ in accordance with the teachings of the present invention. In other words, if the row of the pixel array 306 that is being sampled or read out is Row i, the other rows of pixel array 306 that may be precharged while Row i is being read out with N=10, and exposure factor $M_{exp}=1$, are Rows i+1, i+2, i+4, ..., i+512, and i+1024. The other rows of pixel array 306 are neither read out nor precharged at this time.

Instead, the other rows of pixel array 306 that are not being read out (i.e., sampled) or precharged, may be in an exposure state (i.e., integration state) or in an idle state. In the depicted example, it is appreciated that the transfer transistors of the rows of the pixel array 306 are not in the sample/read out state, precharge state, or exposure/integration state may be partially turned on by the select circuits 332 with the third transfer control signal Vbloom to partially turn on the transfer transistors during the idle state to suppress blooming in accordance with the teachings of the present invention.

Figure 4:
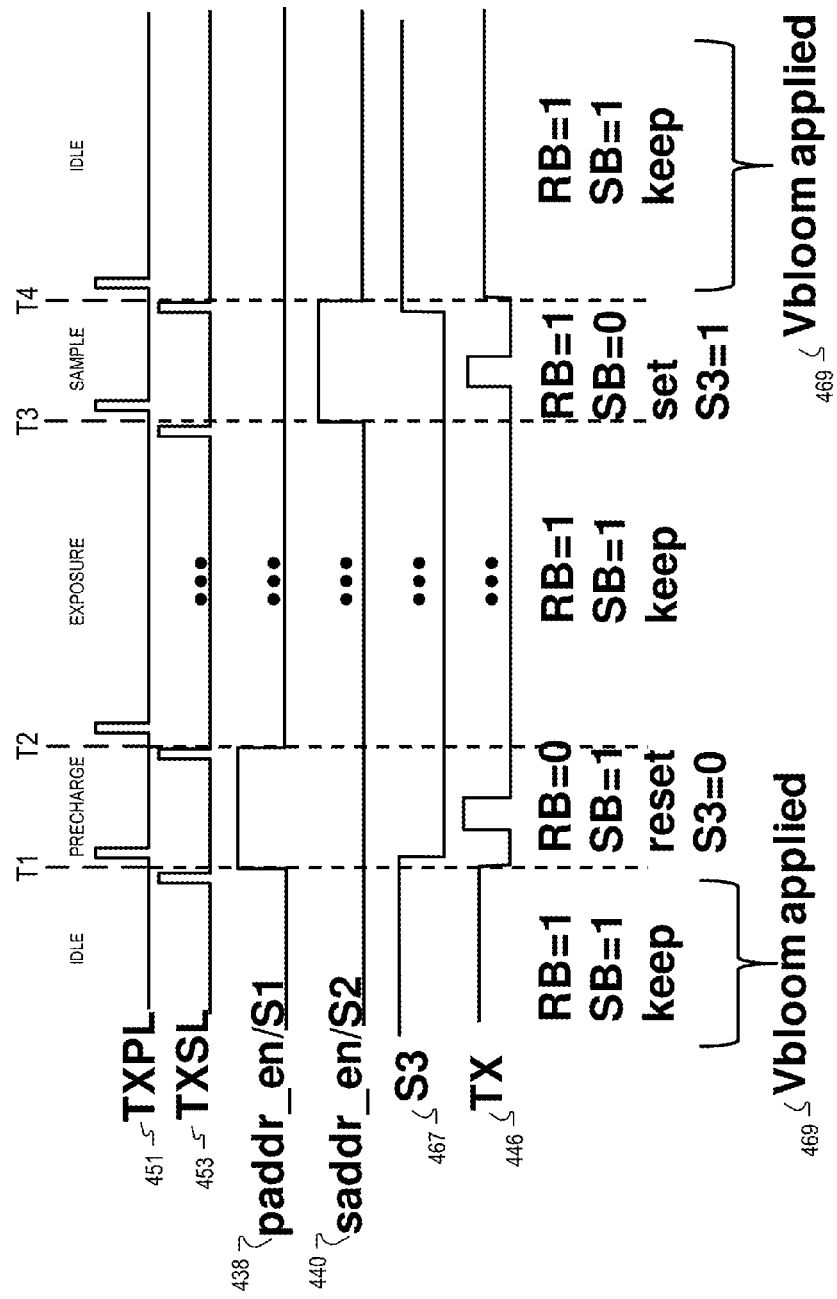
FIG. 4 is a timing diagram illustrating the relationship of the idle state, precharge state, exposure state, sample state, and the associated example signals in an example pixel circuit of a bloom free bloom free imaging system including a pixel array of pixel circuits having a high dynamic range read out architecture using in-frame multi-bit exposure in accordance with the teachings of the present invention.

FIG. 4 is a timing diagram illustrating the relationship of the idle state, precharge state, exposure state, sample state, and the associated example signals in an example pixel circuit of a bloom free imaging system including a pixel array of pixel circuits having a high dynamic range read out architecture using in-frame multi-bit exposure in accordance with the teachings of the present invention. In the illustrated example, it is appreciated that each of the signals illustrated in FIG. 4 may be examples of the signals described in the pixel circuit 210 and select circuit 232 of FIG. 2, and that similarly named and numbered elements referenced below are coupled and function similar to as described above.

As shown, before time T1, and after time T4, the pixel circuit is an idle state. During the idle state of the pixel circuit, Vbloom 469 is applied to the TX signal 446, which results in the transfer transistor being partially turned on to suppress blooming during the idle state in accordance with the teachings of the present invention. As can be appreciated in FIG. 4, the magnitude of the voltage of the TX signal 446 during the idle state is less than the magnitude of the voltage of the TX signal 446 during the precharge state between time T1 and time T2, as well as the magnitude of the voltage of the TX signal 446 during the sample state between time T3 and time T4. During the idle states (before time T1 and after time T4), the set and reset inputs SB and RB of the latch are both equal to 1, which causes the latch to keep or latch the switch S3 467 on to supply Vbloom 469 to TX 446 to suppress blooming in accordance with the teachings of the present invention.

At time T1, the precharge enable signal paddr_en 438 is activated, which causes the S1 switch to be turned on. The pulsing of the first and second clock signals TXSL 453 and TXPL 451 reset the latch, which causes the switch S3 467 to be turned off, which causes the voltage on the TX signal 446 to be pulsed to the higher magnitude voltage of the first transfer control signal PTX during the precharge state of the pixel circuit between time T1 and time T2.

At time T2, the precharge enable signal paddr_en 438 is deactivated the switch S1 to be turned off, and the first and second clock signals TXSL 453 and TXPL 451 are pulsed, which cause the set and reset inputs SB and RB of the latch are both equal to 1, which causes the latch to keep the switch S3 467 off, which keeps the TX 446 low during the exposure state of the pixel circuit between time T2 and T3

At time T3, the sample enable signal saddr_en 440 is activated causing the S2 to be turned on in response to the sample enable signal saddr_en 440, which causes the TX signal 446 to be pulsed to the higher magnitude voltage of the second transfer control signal STX during the sample state of the pixel circuit between times T3 and T4.

At time T4, the sample enable signal saddr_en 440 is deactivated, which causes switch S2 to be turned off. The pulsing of the first and second clock signals TXSL 453 and TXPL 451 set the latch causing the switch S3 467 to be turned on, which causes Vbloom 469 to be applied to the voltage on the TX signal 446 to partially turn on the transfer transistor on to suppress blooming during the idle state in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel circuit, comprising:
   a photodiode adapted to accumulate image charge in response to incident light;
   a transfer transistor coupled between the photodiode and a floating diffusion disposed in the first semiconductor layer to selectively transfer the image charge accumulated in the photodiode to the floating diffusion; and
   a selection circuit coupled to a control terminal of the transfer transistor to select one of a first transfer control signal, a second transfer control signal, or a third transfer control signal to control the transfer transistor,
      wherein the selection circuit is coupled to output the first transfer control signal in response to a precharge enable signal during a read out operation of a different row than a row in which the transfer transistor is included,
      wherein the selection circuit is coupled to output the second transfer control signal in response to a sample enable signal during a read out operation of the row in which the transfer transistor is included, and
      wherein the selection circuit is coupled to output the third transfer control signal to partially turn on the transfer transistor during an idle state of the pixel circuit.

2. The pixel circuit of claim 1, wherein the selection circuit includes:
   a first switch coupled to generate the first transfer control signal in response to the precharge enable signal;
   a second switch coupled to generate the second transfer control signal in response to the sample enable signal;
   a multiplexor circuit coupled to generate the precharge enable signal in response to a selection of one of a plurality of precharge row signals in response to an exposure value signal;
   an exposure memory coupled to store the exposure value signal;
   a latch coupled to be set in response to the sample enable signal and a first clock signal, wherein the latch is coupled to be reset in response to the precharge enable signal and a second clock signal; and
   a third switch coupled to generate the third transfer control signal in response to an output of the latch.

3. The pixel circuit of claim 1, wherein the pixel circuit is one of a plurality of pixel circuits included in a pixel array arranged into a plurality of rows and a plurality of columns.

4. The pixel circuit of claim 1, wherein a total number of rows of the pixel array that can receive the first transfer control signal at a time is equal to a total number of different possible exposure values that can be stored by the exposure memory.

5. The pixel circuit of claim 4, further comprising an automatic exposure control circuit coupled to generate the different possible exposure values stored by the exposure memory.

6. The pixel circuit of claim 1, wherein the first control signal is a precharge transfer control signal, wherein second control signal is a sample transfer control signal, and wherein the third control signal is an anti-blooming transfer control signal.

7. The pixel circuit of claim 6, wherein a magnitude of the anti-blooming transfer control signal is less than a magnitude of the precharge transfer control signal or the sample transfer control signal.

8. The pixel circuit of claim 1, wherein the pixel circuit is adapted to operate in one of a precharge state, an exposure state, a read out state, or the idle state.

9. The pixel circuit of claim 1, wherein the photodiode, the transfer transistor, and the floating diffusion are disposed in a first semiconductor layer, and wherein the selection circuit is disposed in a second semiconductor layer and is coupled to the control terminal of the transfer transistor through a hybrid bond between the first and second semiconductor layers.

10. The pixel circuit of claim 9, further comprising:
    a reset transistor disposed in the first semiconductor layer and coupled to the floating diffusion to selectively reset the floating diffusion;
    an amplifier transistor disposed in the first semiconductor layer and having an amplifier gate coupled to the floating diffusion; and
    a row select transistor disposed in the first semiconductor layer coupled between a bitline and the amplifier transistor.

11. The pixel circuit of claim 9, wherein the first and second semiconductor layers are stacked and coupled together in a stacked chip scheme.

12. An imaging system, comprising:
    a pixel array having a plurality of pixel circuits arranged into a plurality of rows and a plurality of columns, wherein each one of the pixel circuits includes:
       a photodiode adapted to accumulate image charge in response to incident light;
       a transfer transistor coupled between the photodiode and a floating diffusion to selectively transfer the image charge accumulated in the photodiode to the floating diffusion;
       a selection circuit coupled to a control terminal of the transfer transistor to select one of a first transfer control signal, a second transfer control signal, or a third transfer control signal to control the transfer transistor,
          wherein the selection circuit is coupled to output the second transfer control signal in response to a precharge enable signal during a read out operation of a different row than a row in which the transfer transistor is included,
          wherein the selection circuit is coupled to output the second transfer control signal in response to a sample enable signal during a read out operation of the row in which the transfer transistor is included, and wherein the selection circuit is coupled to output the third transfer control signal to partially turn on the transfer transistor during an idle state of the pixel circuit including the photodiode;

control circuitry coupled to the pixel array to control operation of the pixel array, wherein the selection circuit is included in the control circuitry; and read out circuitry disposed in the second semiconductor layer and coupled to the pixel array to read out image data from the plurality of pixel circuits.

13. The imaging system of claim 12, further comprising function logic coupled to the read out circuitry to store the image data read out from the plurality of pixel circuits.

14. The imaging system of claim 12, wherein the selection circuit includes:

a first switch coupled to generate the first transfer control signal in response to the precharge enable signal;

a second switch coupled to generate the second transfer control signal in response to the sample enable signal;

a multiplexor circuit coupled to generate the precharge enable signal in response to a selection of one of a plurality of precharge row signals in response to an exposure value signal;

an exposure memory coupled to store the exposure value signal;

a latch coupled to be set in response to the sample enable signal and a first clock signal, wherein the latch is coupled to be reset in response to the precharge enable signal and a second clock signal; and a third switch coupled to generate the third transfer control signal in response to an output of the latch.

15. The imaging system of claim 12, wherein a total number of rows of the pixel array that can receive the first transfer control signal at a time is equal to a total number of different possible exposure values that can be stored by the exposure memory.

16. The imaging system of claim 15, wherein the control circuitry further comprises an automatic exposure control circuit coupled to generate the different possible exposure values stored by the exposure memory.

17. The imaging system of claim 12, wherein the first control signal is a precharge transfer control signal, wherein second control signal is a sample transfer control signal, and wherein the third control signal is an anti-blooming transfer control signal.

18. The imaging system of claim 17, wherein a magnitude of the anti-blooming transfer control signal is less than a magnitude of the precharge transfer control signal or the sample transfer control signal.

19. The imaging system of claim 12, wherein each pixel circuit is adapted to operate in one of a precharge state, an exposure state, a read out state, or the idle state.

20. The imaging system of claim 12, wherein the photodiode, the transfer transistor, and the floating diffusion are disposed in a first semiconductor layer, and wherein the selection circuit is disposed in a second semiconductor layer and is coupled to the control terminal of the transfer transistor through a hybrid bond between the first and second semiconductor layers.

21. The imaging system of claim 20, wherein each one of the pixel circuits further includes:

a reset transistor disposed in the first semiconductor layer and coupled to the floating diffusion to selectively reset the floating diffusion;

an amplifier transistor disposed in the first semiconductor layer and having an amplifier gate coupled to the floating diffusion; and a row select transistor disposed in the first semiconductor layer coupled between a bitline and the amplifier transistor.

22. The imaging system of claim 20, wherein the first and second semiconductor layers are stacked and coupled together in a stacked chip scheme.

* * * * *